(12) United States Patent
Nakashiba

(10) Patent No.: US 7,667,279 B2
(45) Date of Patent: Feb. 23, 2010

(54) SEMICONDUCTOR DEVICE

(75) Inventor: Yasutaka Nakashiba, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 198 days.

(21) Appl. No.: 12/024,550

(22) Filed: Feb. 1, 2008

(65) Prior Publication Data

US 2008/0185685 A1    Aug. 7, 2008

(30) Foreign Application Priority Data

Feb. 1, 2007  (JP) .............................. 2007-023508

(51) Int. Cl.
*H01L 29/76*  (2006.01)
*H01L 23/52*  (2006.01)
*H01L 21/66*  (2006.01)

(52) U.S. Cl. ..................... 257/409; 257/484; 257/508; 257/532; 257/535; 257/659; 257/E23.18; 257/E23.127; 257/E23.002; 257/E23.142

(58) Field of Classification Search ................ 257/409, 257/484, 508, 532, 535
See application file for complete search history.

(56) References Cited

U.S. PATENT DOCUMENTS

| 7,411,257 B2* | 8/2008 | Yoshizawa et al. | 257/409 |
| 7,453,128 B2* | 11/2008 | Tsutsue et al. | 257/409 |
| 2004/0150070 A1* | 8/2004 | Okada et al. | 257/508 |
| 2009/0001515 A1* | 1/2009 | Yamagata | 257/532 |

FOREIGN PATENT DOCUMENTS

JP    2006-269519 A    10/2006

* cited by examiner

*Primary Examiner*—Dao H Nguyen
(74) *Attorney, Agent, or Firm*—Young & Thompson

(57) ABSTRACT

Disclosed is a semiconductor device which has a circuit-forming region. The semiconductor device has a semiconductor substrate, a plurality of insulating interlayer films, a guard ring, and a first MIM capacitor. The insulating interlayer films, which are stacked one upon another, are provided over the semiconductor substrate. The guard ring is formed in the plurality of insulating interlayer films and surrounds the circuit-forming region. The guard ring is separated from an insulating interlayer film including a topmost interconnect. The MIM capacitor is provided between the guard ring and the insulating interlayer film including the topmost interconnect.

12 Claims, 3 Drawing Sheets

SEMICONDUCTOR DEVICE

This application is based on Japanese patent application No. 2007-023508 which is incorporated herein by reference.

BACKGROUND

1. Technical Field

The present invention relates to a semiconductor device.

2. Related Art

FIG. 2 is a plan view showing a conventional semiconductor device 100. FIG. 3 is a sectional view taken along line III-III of FIG. 2. In the semiconductor device 100, seal rings 102 are formed so as to surround a circuit-forming region 101, thus preventing penetration of moisture or ions into the circuit-forming region 101. FIGS. 2 and 3 illustrate the exemplary seal rings which have a triple ring structure.

These seal rings 102 are formed, as shown in FIG. 3, in an insulating interlayer structure 111 over a semiconductor substrate 110. Each seal ring 102 extends across the entire thickness of the insulating interlayer structure 111. The insulating interlayer structure 111 is comprised of an insulating interlayer group 111a made of silicon oxide, and an insulating interlayer group 111b made of a low-dielectric-constant (low-k) material. Over the insulating interlayer structure 111, a protective film 112 is formed.

In the semiconductor device 100, an MIM (metal-insulator-metal) capacitor 113 can be used as a decoupling capacitor to reduce IR drop. The MIM capacitor 113 can be formed in an insulating interlayer film between the topmost interconnect and interconnects formed below the topmost interconnect. Japanese Patent Application Publication No. 2006-269519 discloses a technique relevant to the present invention.

The present inventor has recognized as follows: To test the reliability of the MIM capacitor 113, an MIM capacitor as a test capacitor is necessarily formed in the same insulating interlayer film as the MIM capacitor 113. In order to effectively test the reliability, a certain amount of region is necessary for forming the MIM capacitor for testing, although the region may not necessarily be as large as that of the MIM capacitor 113. The MIM capacitor for testing can be formed in a sufficiently large region, however, resulting in an increase in the chip area.

SUMMARY

According to the present invention, there is provided a semiconductor device having a circuit-forming region. The semiconductor device includes: a semiconductor substrate; a plurality of insulating interlayer films provided over the semiconductor substrate and being stacked one upon another; a guard ring formed in the plurality of insulating interlayer films and surrounding the circuit-forming region. The guard ring is separated from a first insulating interlayer film of the plurality of insulating interlayer films, and the first insulating interlayer film includes a topmost interconnect. The semiconductor device further includes a first MIM (metal-insulator-metal) capacitor formed between the guard ring and the first insulating interlayer film.

In the semiconductor device according to the present invention, the first MIM capacitor as an MIM capacitor for testing can be formed in a region above the guard ring, thereby to obtain a sufficiently large region for forming the MIM capacitor for testing, without increasing the chip area.

Therefore, according to the present invention, the semiconductor device is capable of providing the MIM capacitor for testing in a sufficiently large region, without increasing the chip area.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will now be described with reference to an illustrative embodiment. Those skilled in the art will recognize that many alternative embodiments can be accomplished using the teachings herein, and that the invention is not limited to the exemplary embodiment illustrated for explanatory purposes.

Paragraphs below will detail a preferred embodiment of the present invention, with reference to the attached drawings.

Figure 1:
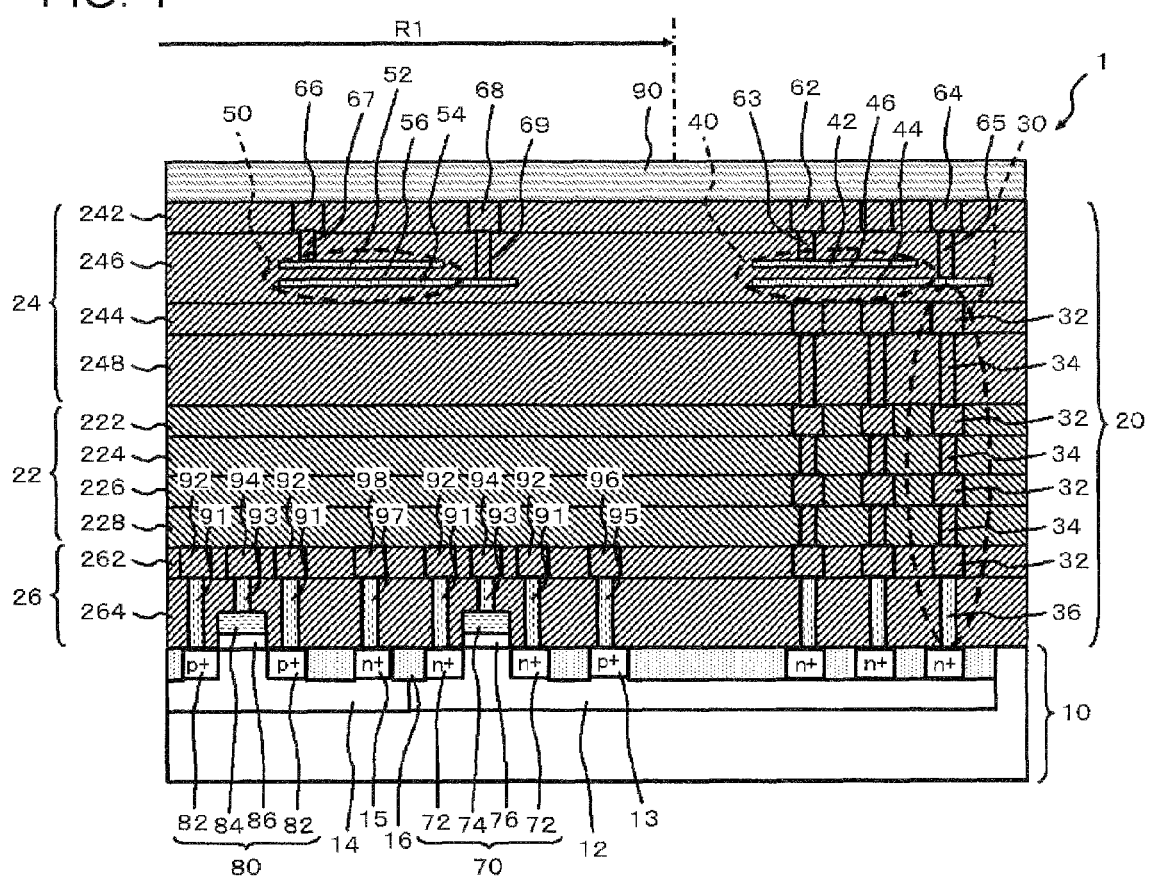
FIG. 1 is a sectional view showing a semiconductor device of an exemplary embodiment according to the present invention.

FIG. 1 is a sectional view showing a semiconductor device 1 of an exemplary embodiment according to the present invention. FIG. 1 illustrates the schematic cross-sectional structure of the semiconductor device 1, similar to that illustrated in FIG. 3. The semiconductor device 1 has a circuit-forming region R1. The semiconductor device 1 further has a semiconductor substrate 10, a plurality of insulating interlayer films 20, a seal ring 30 (or a guard ring), and an MIM capacitor 40 (or a first MIM capacitor). In this embodiment, the semiconductor substrate 10 is a p-type silicon substrate.

Over the semiconductor substrate 10, the plurality of insulating interlayer films 20 that are stacked one upon another is formed. Over the plurality of insulating interlayer films 20, a protective film 90 is formed. The plurality of insulating interlayer films 20 includes: an insulating interlayer group 22 (or a first insulating interlayer group); an insulating interlayer group 24 (or a second insulating interlayer group) formed over the insulating interlayer group 22; and an insulating interlayer group 26 (or a third insulating interlayer group) formed between the semiconductor substrate 10 and the insulating interlayer group 22.

The insulating interlayer group 22 consists of insulating interlayer films 222, 224, 226, 228 that are stacked one upon another. The insulating interlayer group 24 consists of insulating interlayer films 242, 244, 246, 248 that are stacked one upon another. The insulating interlayer group 26 consists of insulating interlayer films 262, 264 that are stacked one upon the other. The insulating interlayer films 222, 226, 242, 244, 262 has their respective interconnects embedded therein. With respect to these insulating interlayer films, the insulating interlayer film 242 has the topmost interconnects of the semiconductor device 1. The insulating interlayer film 244 has second interconnects below the topmost interconnects. The insulating interlayer films 224, 228, 246, 248 each have via plugs embedded therein. The insulating interlayer film 264 has contact plugs embedded therein.

The insulating interlayer group 22, the insulating interlayer group 24 and the insulating interlayer group 26 are formed by using a first insulating material, a second insulating material and a third insulating material, respectively. Both of the second and third insulating materials have their respective dielectric constants larger than that of the first insulating material. The first insulating material preferably has a dielectric constant of 3.5 or smaller. On the other hand, the second and third insulating materials preferably has their respective dielectric constants of 4.0 or larger. The second and third insulating materials can be the same material or can be different kinds of materials. In this embodiment, the first insulating material is a low-k material, and the second and third insulating materials can be silicon oxide materials.

A reason why an insulating material having a low dielectric constant is not used for the upper insulating interlayer group 24 is as follows. It is generally necessary for interconnects formed in upper layers to be thickened, brought more distant from each other, and more widened in their line width. This is because an upper interconnect of the interconnects is used as a power source line, a GND line or a signal line that transmits an electrical information signal over a relatively long distance. Accordingly, in the upper insulating interlayer group 24, interconnect resistance and parasitic capacitance between the adjacent interconnects, which are causative of interconnect delay, can be reduced, and thereby there is only a small need of using an insulating material having a low dielectric constant. In addition, by not using a low-k material as a material of the insulating interlayer group 24, penetration of moisture or ions from an external upper region can be prevented. As the material of the insulating interlayer group 26, one or more oxide films having a relatively high dielectric constant can be used, because the group 26 is a local interconnect group.

As the low-k material, for example, the following materials can be used: polyorganosiloxane, organic materials containing aromatic groups, hydrogen silsesquioxane (HSQ), spin-on glass (SOG), and flowable oxide (FOX). Examples of polyorganosiloxane include SiOC, methyl silsesquioxane (MSQ), and methylated hydrogen silsesquioxane (MHSQ). Examples of organic materials containing aromatic groups are polyphenylene, polyaryl ether (PAE), and divinylsiloxane-bis-benzocyclobutene.

Figure 2:
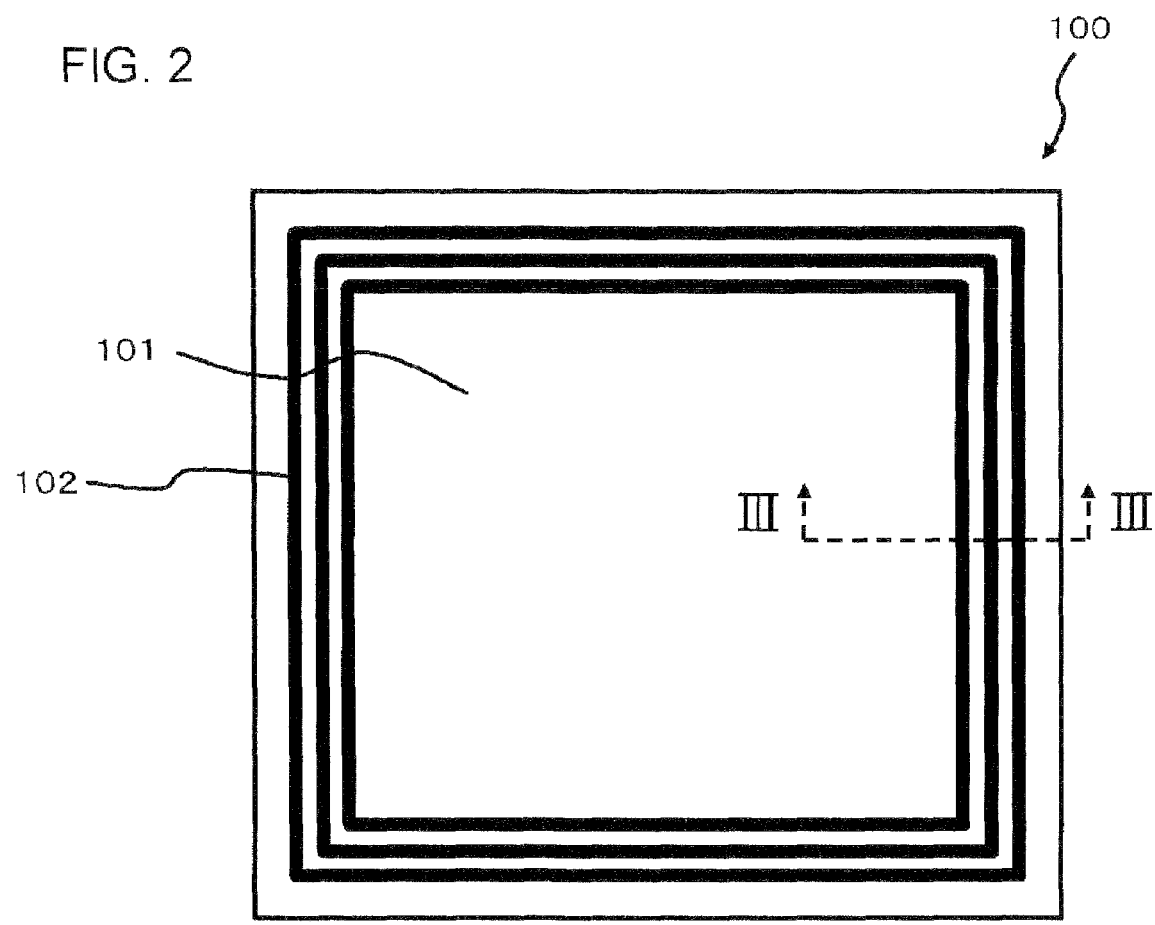
FIG. 2 is a plan view showing a conventional semiconductor device.
Figure 3:
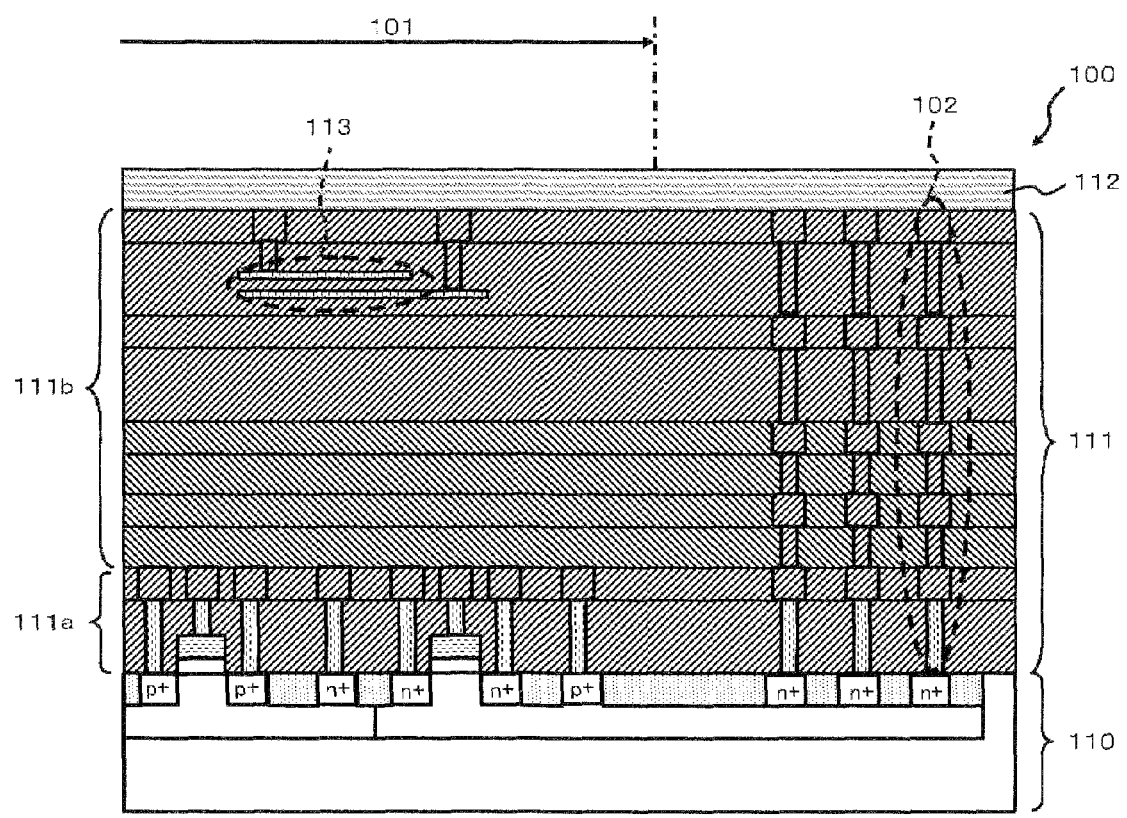
FIG. 3 is a sectional view taken along line III-III of FIG. 2.

The plurality of insulating interlayer films 20 has seal rings 30 formed therein. The seal rings 30 surround the circuit-forming region R1. Similarly to the structure as shown in FIGS. 2 and 3, the seal rings 30 have a triple ring structure. Each seal ring 30 is composed of electroconductive components 32, 34, 36 that are electrically connected to each other. Interconnects in the circuit-forming region R1 and the electroconductive component 32 are formed in the same layer. The electroconductive component 32 is composed of the same material as the interconnects in the circuit-forming region R1. The via plugs in the circuit-forming region R1 and the electroconductive component 34 are formed in the same layer. The electroconductive component 34 is composed of the same material as the via plugs in the circuit-forming region R1. The contact plugs in the circuit-forming region R1 and the electroconductive component 36 are formed in the same layer. The electroconductive component 36 is composed of the same material as the contact plugs in the circuit-forming region R1.

In this embodiment, each seal ring 30 extends from the interface between the insulating interlayer film 244 and the insulating interlayer film 246 towards the semiconductor substrate 10. As a consequence, each seal ring 30 extends through both the interface between the insulating interlayer group 22 and the insulating interlayer group 24, and the interface between the insulating interlayer group 22 and the insulating interlayer group 26. The seal ring 30 is separated from the insulating interlayer film 242 having the topmost interconnects embedded therein.

The MIM capacitor 40 is formed between the seal ring 30 and the insulating interlayer film 242. The MIM capacitor 40 is used and functions as an MIM capacitor for testing. More specifically, the MIM capacitor 40 is formed in the insulating interlayer film 246 of the insulating interlayer group 24. The MIM capacitor 40 is formed so as to overlap the seal rings 30, as seen in a plan view of the semiconductor device 1. In the cross-sectional plane shown in FIG. 1, that is, in the cross-sectional plane perpendicular to a direction in which the guard rings 30 extends, the MIM capacitor 40 has a width larger than the maximum width of each seal ring 30. As illustrated in FIG. 1, the width of the electroconductive component 32 corresponds to the maximum width. This structure enables the region of the MIM capacitor 40 for testing to be sufficiently large. Internal devices can be formed at predetermined intervals in the vicinity of the seal rings 30, thus enabling an increase in the chip size to be avoided even when the MIM capacitor 40 has a width larger than those of the seal rings 30.

The MIM capacitor 40 is comprised of an upper electrode 42, a lower electrode 44, and a capacitive insulating film 46 disposed between these electrodes 42 and 44. The upper electrode 42 is connected to an interconnect 62 through an electroconductive plug 63. Similarly, the lower electrode 44 is connected to an interconnect 64 through an electroconductive plug 65.

An MIM capacitor 50 (or a second MIM capacitor) and the MIM capacitor 40 are formed in the same insulating interlayer film (i.e., the insulating interlayer film 246). The MIM capacitor 50 is located in the circuit-forming region R1, and functions as a decoupling capacitor. The area of the MIM capacitor 50 is larger than that of the MIM capacitor 40. For an exemplary chip having 17 mm square, the areas of the MIM capacitor 40 and the MIM capacitor 50 have approximately 0.15 $mm^2$ and approximately 40 $mm^2$, respectively. It is, nonetheless, to be understood that the MIM capacitor 40 and the MIM capacitor 50 are illustrated in FIG. 1 to have the same size for the sake of simplicity.

The MIM capacitor 50 is comprised of an upper electrode 52, a lower electrode 54, and a capacitive insulating film 56 disposed between these electrodes 52 and 54. The upper electrode 52, the lower electrode 54 and the capacitive insulating film 56 are composed of their respective same materials as the upper electrode 42, the lower electrode 44 and the capacitive insulating film 46, respectively. The upper electrode 52 is connected to an interconnect 66 through an electroconductive plug 67. Similarly, the lower electrode 54 is connected to an interconnect 68 through an electroconductive plug 69.

In the semiconductor substrate 10, a p-type well region 12 and an n-type well region 14 are formed. In the p-type well region 12 and the n-type well region 14, source/drain regions ($n^+$-type diffused layer) 72 and source/drain regions ($p^+$-type diffused layer) 82 are respectively formed. The source/drain regions 72 constitute an n-channel field effect transistor (FET) 70 together with a gate electrode 74 and a gate insulating film 76.

Similarly, the source/drain regions 82 constitute a p-channel FET 80 together with a gate electrode 84 and a gate insulating film 86. These n-channel FET 70 and the p-channel FET 80 are isolated from each other by an element isolation region 16.

Each of the source/drain regions 72, 82 is connected to an interconnect 92 through a contact plug 91. Each of the gate electrodes 74, 84 is connected to an interconnect 94 through a con-tact plug 93. The p-type well region 12 is connected to an interconnect 96 through a p+-type diffused layer 13 and a contact plug 95. Similarly, the n-type well region 14 is connected to an interconnect 98 through a n+-type diffused layer 15 and a contact plug 97.

Advantages of this embodiment described above will be explained. The MIM capacitor for testing (i.e., an MIM capacitor 40) is disposed in a region above the seal rings 30 (i.e., in a region between the seal rings 30 and the insulating interlayer film 242). This structure enables a sufficiently large region for forming the MIM capacitor 40, without an increase in the chip area.

In contrast, in the semiconductor device 100 (having a chip size of 17 mm square) shown in FIGS. 2 and 3, when an MIM capacitor for testing is provided, the area of the MIM capacitor for testing is at most as large as 0.001 mm$^2$ or around. This MIM capacitor is not capable of ensuring a sufficient performance for monitoring (or detection) because of such very small area. On the other hand, in the semiconductor device 1 having a chip size of 17 mm square, the MIM capacitor 40 having an area as large as 0.15 mm$^2$ or around can be provided as described above. This area is sufficiently large to allow the MIM capacitor 40 to function as an MIM capacitor for testing.

In addition, according to this embodiment, chipping of the device chip caused by dicing a wafer of the semiconductor device 1 can be electrically detected. More specifically, if the chipping reaches the seal ring region, then, the MIM capacitor 40 or any components (e.g., the electroconductive plug 65) electrically connected to the seal ring region can be damaged. This damage can be detected based on the results of measurement a capacitance of the MIM capacitor 40, because the measured capacitance is affected by the chipping. For example, the measured capacitance can appear to show abnormal values, or the measurement of capacitance per se may be made impossible. Therefore, the MIM capacitor 40 can be used as a chipping sensor capable of detecting the chipping.

The seal rings 30 extend across the insulating interlayer group 22. This structure effectively prevents penetration of moisture or ions into the circuit-forming region R1 through the insulating interlayer group 22. The low-k material composing the insulating interlayer group 22 is less effective to prevent the penetration of moisture or the like, as compared with silicon oxide or the like. In order to improve reliability of the semiconductor device 1, it is therefore especially important to prevent the penetration of moisture or the like through the insulating interlayer group 22.

Moreover, in this embodiment, the seal rings 30 extend through the interface between the insulating interlayer group 22 and the insulating interlayer group 24, and through the interface between the insulating interlayer group 22 and the insulating interlayer group 26. This structure also effectively prevents penetration of moisture or the like through these interfaces.

The present invention is not limited to the above-described exemplary embodiment, and instead allows various modifications. For example, as an exemplary structure of the preferred embodiment described above, the seal rings 30 extend through the interface between the insulating interlayer group 22 and the insulating interlayer group 24. Alternatively, the seal rings 30 can terminate at the interface. In other words, one end of each seal ring 30 can correspond with the interface between the insulating interlayer group 22 and the insulating interlayer group 24. The same structure can be applied also to the interface between the insulating interlayer group 22 and the insulating interlayer group 26, and the seal rings 30 can terminate at the interface between the insulating interlayer group 22 and the insulating interlayer group 26.

Furthermore, in the above-described preferred embodiment, the insulating interlayer group 22 is composed of a low-k material, and the insulating interlayer groups 24, 26 are composed of silicon oxide, no limitation thereto intended. For example, the entire portion of the plurality of insulating interlayer films 20 can be composed of a low-k material, or the entire portion of the plurality of insulating interlayer films 20 can be composed of silicon oxide.

It is apparent that the present invention is not limited to the above embodiment, that may be modified and changed without departing from the scope and spirit of the invention.

What is claimed is:

1. A semiconductor device having a circuit-forming region, comprising:
    a semiconductor substrate;
    a plurality of insulating interlayer films provided over said semiconductor substrate and being stacked one upon another, said plurality of insulating interlayer films including a first insulating interlayer film which has a topmost interconnect;
    a guard ring formed in said plurality of insulating interlayer films and surrounding said circuit-forming region, said guard ring being separated from said first insulating interlayer film; and
    a first MIM capacitor formed between said guard ring and said first insulating interlayer film.

2. The semiconductor device according to claim 1, wherein said plurality of insulating interlayer films includes:
    a first insulating interlayer group made of a first insulating material across which said guard ring extends; and
    a second insulating interlayer group formed over said first insulating interlayer group and made of a second insulating material having a dielectric constant larger than that of said first insulating material, said second insulating interlayer group including said first MIM capacitor.

3. The semiconductor device according to claim 2, wherein said first insulating material has a dielectric constant of 3.5 or smaller, and said second insulating material has a dielectric constant of 4.0 or larger.

4. The semiconductor device according to claim 2, wherein said first insulating material has a low dielectric constant, and said second insulating material is a silicon oxide material.

5. The semiconductor device according to claim 2, wherein said guard ring extends through an interface between said first and said second insulating interlayer groups.

6. The semiconductor device according to claim 2, wherein said second insulating interlayer group includes:
    said first insulating interlayer film;
    a second insulating interlayer film in which a second interconnect is formed below said topmost interconnect; and
    a third insulating interlayer film disposed between said first and said second insulating interlayer films, and having said first MIM capacitor therein.

7. The semiconductor device according to claim 2, wherein said plurality of insulating interlayer films further includes a third insulating interlayer group provided between said semiconductor substrate and said first insulating interlayer group, said third insulating interlayer group being made of a third insulating material having a dielectric constant larger than that of said first insulating material.

8. The semiconductor device according to claim 7, wherein said guard ring extends through an interface between said first and said third insulating interlayer groups.

9. The semiconductor device according to claim 1, further comprising a second MIM capacitor formed in the same insulating interlayer film as the insulating interlayer film in which said first MIM capacitor is formed, said second MIM capacitor being disposed in said circuit-forming region.

10. The semiconductor device according to claim 9, wherein said second MIM capacitor has an area larger than that of said first MIM capacitor.

11. The semiconductor device according to claim 1, wherein, in a cross-sectional plane perpendicular to a direction in which said guard ring extends, said first MIM capacitor has a width larger than a maximum width of said guard ring.

12. The semiconductor device according to claim 1, wherein said first MIM capacitor is formed above said guard ring and within one or more insulating interlayer films of said plurality of insulating interlayer films.

* * * * *